United States Patent
Hsieh et al.

(10) Patent No.: US 7,098,126 B2
(45) Date of Patent: Aug. 29, 2006

(54) FORMATION OF ELECTROPLATE SOLDER ON AN ORGANIC CIRCUIT BOARD FOR FLIP CHIP JOINTS AND BOARD TO BOARD SOLDER JOINTS

(75) Inventors: Han-Kun Hsieh, MiaoLi (TW); Shing-Ru Wang, Taipei (TW); I-Chung Tung, Hsinchu (TW)

(73) Assignee: Phoenix Precision Technology Corp., (TW)

( * ) Notice: Subject to any disclaimer, the term of this patent is extended or adjusted under 35 U.S.C. 154(b) by 0 days.

(21) Appl. No.: 10/052,989

(22) Filed: Nov. 9, 2001

(65) Prior Publication Data

US 2003/0022477 A1    Jan. 30, 2003

(30) Foreign Application Priority Data

Jul. 27, 2001    (TW) ................. 90118363 A

(51) Int. Cl.
  *H01L 21/44*    (2006.01)
(52) U.S. Cl. ........................ 438/614; 257/772
(58) Field of Classification Search ........ 438/106–108, 438/118–119, 612–614, 618, 653, 654, 656; 257/766–772, 750, 751, 753, 774, 762–764, 257/E21.508
See application file for complete search history.

(56) References Cited

U.S. PATENT DOCUMENTS

| | | | | |
|---|---|---|---|---|
| 3,958,048 A | * | 5/1976 | Donovan et al. | 427/304 |
| 5,822,856 A | * | 10/1998 | Bhatt et al. | 29/832 |
| 5,903,058 A | * | 5/1999 | Akram | 257/778 |
| 6,130,141 A | * | 10/2000 | Degani et al. | 438/455 |
| 6,348,399 B1 | * | 2/2002 | Lin | 438/616 |
| 6,358,836 B1 | * | 3/2002 | Lu et al. | 438/618 |
| 6,375,062 B1 | * | 4/2002 | Higdon et al. | 228/214 |
| 6,387,734 B1 | * | 5/2002 | Inaba et al. | 438/125 |
| 6,392,143 B1 | * | 5/2002 | Koshio | 174/52.4 |
| 6,489,229 B1 | * | 12/2002 | Sheridan et al. | 438/614 |
| 6,576,545 B1 | * | 6/2003 | Hopper et al. | 438/624 |

* cited by examiner

Primary Examiner—David Vu

(57) ABSTRACT

A method of fabricating electroplate solder on an organic circuit board for forming flip chip joints and board to board solder joints is disclosed. In the method, there is initially provided an organic circuit board including a surface bearing electrical circuitry that includes at least one contact pad. A solder mask layer that is placed on the board surface and patterned to expose the pad. Subsequently, a metal seed layer is deposited by physical vapor deposition, chemical vapor deposition, electroless plating with the use of catalytic copper, or electroplating with the use of catalytic copper, over the board surface. A resist layer with at least an opening located at the pad is formed over the metal seed layer. A solder material is then formed in the opening by eletroplating. Finally, the resist and the metal seed layer beneath the resist are removed.

10 Claims, 9 Drawing Sheets

FORMATION OF ELECTROPLATE SOLDER ON AN ORGANIC CIRCUIT BOARD FOR FLIP CHIP JOINTS AND BOARD TO BOARD SOLDER JOINTS

BACKGROUND OF THE INVENTION

1. Field of Invention

This invention generally relates to the electronic packages, particularly to flip chip packages, more particularly to flip chip joints and board to board solder joints formed by electroplated solder on the organic circuit boards.

2. Description of the Related Art

Since the introduction of the flip chip technology by IBM in the early 1960s, the flip chip devices have been mounted on an expensive ceramic substrate where the thermal expansion mismatch between the silicon chip and the ceramic substrate is less critical. In comparison with wire bonding technology, the flip chip technology is better able to offer higher packaging density (lower device profile) and higher electrical performance (shorter possible leads and lower inductance). On this basis, the flip chip technology has been industrially practiced for the past 40 years using high-temperature solder (controlled-collapse chip connection, C4) on ceramic substrates. However, in recent years, driven by the demand of high-density, high-speed and low-cost semiconductor devices for the trend of miniaturization of modern electronic products, the flip chip devices mounted on a low-cost organic circuit board (e.g. printed circuit board or substrate) with an epoxy underfill to mitigate the thermal stress induced by the thermal expansion mismatch between the silicon chip and organic board structure have experienced an obviously explosive growth. This notable advent of low-temperature flip chip joints and organic-based circuit board has enabled the current industry to obtain inexpensive solutions for fabrication of flip chip devices.

In the current low-cost flip chip technology, the top surface of the semiconductor integrated circuit (IC) chip has an array of electrical contact pads. The organic circuit board has also a corresponding grid of contacts. The low-temperature solder bumps or other conductive adhesive material are placed and properly aligned in between the chip and circuit board. The chip is flipped upside down and mounted on the circuit board, in which the solder bumps or conductive adhesive material provide electrical input/output (I/O) and mechanical interconnects between the chip and circuit board. For solder bump joints, an organic underfill encapsulant may be further dispensed into the gap between the chip and circuit board to constrain the thermal mismatch and lower the stress on the solder joints.

In general, for achieving a flip chip assembly by solder joints, the metal bumps, such as solder bumps, gold bumps or copper bumps, are commonly pre-formed on the pad electrode surface of the chip, in which the bumps can be any shape, such as stud bumps, ball bumps, columnar bumps, or others. The corresponding solder bumps (or say presolder bumps), typically using a low-temperature solder, are also formed on the contact pads of the circuit board. At a reflow temperature, the chip is bonded to the circuit board by means of the solder joints. After dispensing of an underfill encapsulant, the flip chip device is thus constructed. The typical examples of the flip chip devices using solder joints are shown in FIGS. 1 and 2. FIG. 1 is an example of the typical flip chip devices with the use of metal bumps and presolder bumps. The metal bumps 101 are formed on the electrode pads 102 of the chip 103. The presolder bumps 104 made of low-temperature solder are formed on the contact pads 105 of the organic circuit board 106. The solder joints 107 are formed at a reflow temperature sufficient to melt and reflow the presolder bumps 104. After dispensing of an underfill encapsulant 107 into the gap between the chip 103 and circuit board 106, the flip chip device 100 is thus accomplished. FIG. 2 shows another example of the typical flip chip devices without using presolder bumps. The solder bumps 201 are formed on the electrode pads 202 of the chip 203. The chip 203 is bonded to the circuit board 204 at a reflow temperature, in which the solder joints 205 are formed at the contact pads 206. After dispensing of an underfill encapsulant 207 into the gap between the chip 203 and circuit board 204, the flip chip device 200 is thus accomplished.

Currently, the most common method for formation of presolder bumps on the circuit board is the stencil printing method. Some prior proposals in relation to the stencil printing method can be referred to U.S. Pat. No. 5,203,075 (C. G. Angulas et al.), U.S. Pat. No. 5,492,266 (K. G. Hoebener et al.) and U.S. Pat. No. 5,828,128 (Y. Higashiguchi et al.). Solder bumping technique for flip chip assemblies requires design considerations regarding both bump pitch and size miniaturization. According to practical experiences, the stencil printing will become infeasible once the bump pitch is decreased below ~0.15 millimeter. In contrast, the solder bumps deposited by electroplating offers the ability to further reduce bump pitch down to below 0.15 millimeter. The prior proposals in relation to electroplate bumps on the circuit board for flip chip bonding can be found in U.S. Pat. No. 5,391,514 (T. P. Gall et al.) and U.S. Pat. No. 5,480,835 (K. G. Hoebener et al.). Although eletroplate solder bumping on the circuit board offers finer bump pitch over stencil printing, it presents several challenges for initial implementation. For example, the solder mask layer should not be damaged during the fabrication process of solder bumps. Also, the plating and bump height uniformity should also be established. These issues were not detailed in either U.S. Pat. Nos. 5,391,514 or 5,480,835.

Accordingly, it is desirable to provide an electroplating process for fabricating solder bumps on an organic circuit board, which does not damage solder mask layers and offers good plating and bump height uniformity.

SUMMARY OF INVENTION

It is therefore an objective of the present invention to provide a method to form a metal seed layer on an organic circuit board without significantly damaging the solder mask layer, which is used to produce electroplate solder for forming flip chip joints and board to board solder joints.

Another objective of this invention is to adopt a physical vapor deposition method for forming the metal seed layer.

Another further objective of this invention is to adopt a chemical vapor deposition method for forming the metal seed layer.

Another further objective of the present invention is to adopt an electroless plating method for forming the metal seed layer, wherein the surfaces of said solder mask layer and said pad are coated with aqueous solutions, which at least contain copper ions, followed by reduction of said copper ions to form the catalytic copper. With assistance of the catalytic copper, the metal seed layer can then be formed by the electroless plating method.

Another further objective of the present invention is to adopt an electroplating method for forming the metal seed layer, wherein the surfaces of said solder mask layer and said pad are coated with aqueous solutions, which at least contain copper ions, followed by reduction of said copper ions to form the catalytic copper. With assistance of the catalytic copper, a first thin metal layer can thus be formed by the electroless plating method. With the use of the thin metal layer as an electrode, the second thin metal layer can then be formed by the electroplating method. The metal seed layer is a combination of the first and second thin metal layers.

In summary, a method of fabricating electroplate solder on an organic circuit board for forming flip chip joints and board to board solder joints is disclosed. According to the present invention, there is provided an organic circuit board including a surface bearing electrical circuitry which includes at least one contact pad. A solder mask layer that is placed on the board surface and patterned to expose the pad. Subsequently, a metal seed layer is deposited by physical vapor deposition, chemical vapor deposition, electroless plating with the use of catalytic copper, or electroplating with the use of catalytic copper, over the board surface. A resist layer with at least an opening located at the pad is formed over the metal seed layer. A solder material is then formed in the opening by electroplating. Finally, the resist and the metal seed layer beneath the resist are removed.

DETAILED DESCRIPTION OF THE PREFERRED EMBODIMENT

For a better understanding on the advantages and capabilities of the present invention, reference is made to the following disclosure, appended claims in connection with the accompanying drawings. It will be obvious to one skilled in the art that the principle feature of the invention may be employed in various embodiments without departing from the scope of the invention.

The invention provides an electroplating process for fabricating solder bumps on an organic circuit board, which is able to form solder bumps with good plating uniformity but without significantly damaging solder mask layers. The method is detailed as follows. Like numbers refer to like elements throughout. However, the figures are simply illustrative of the process, and are not drawn to scale, i.e. they do not reflect the actual dimensions or features of the various layers in the chip package structure.

Figure 1A:
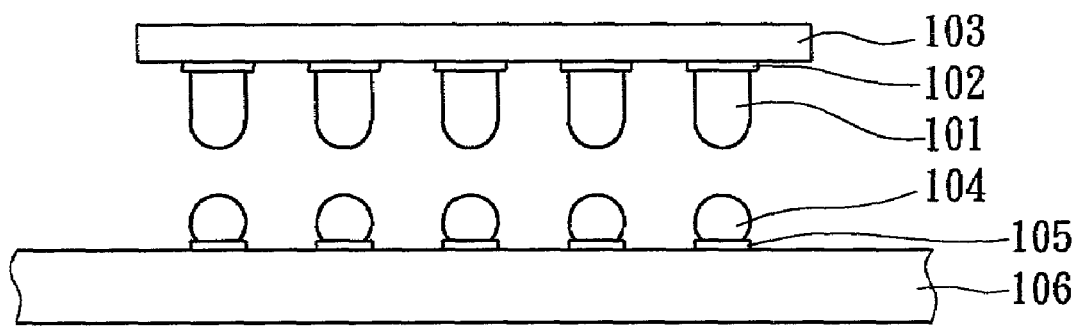
FIGS. 1A and 1B are cross-sectional views of a prior art of the typical flip chip devices with the use of metal bumps and presolder bumps techniques.
Figure 1B:
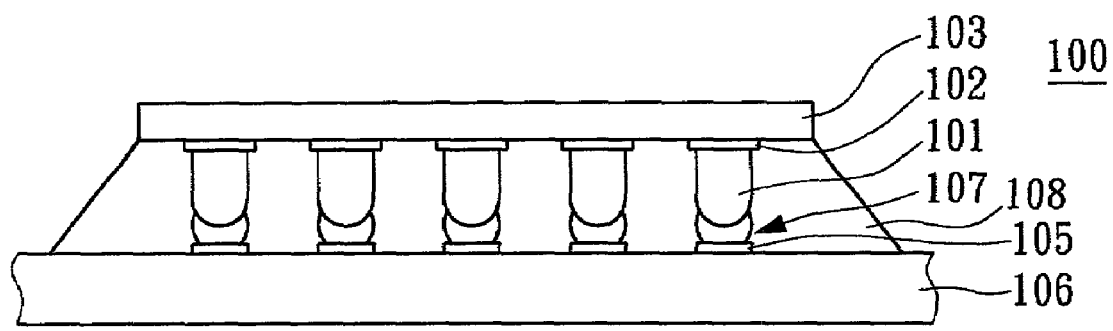
Figure 2A:
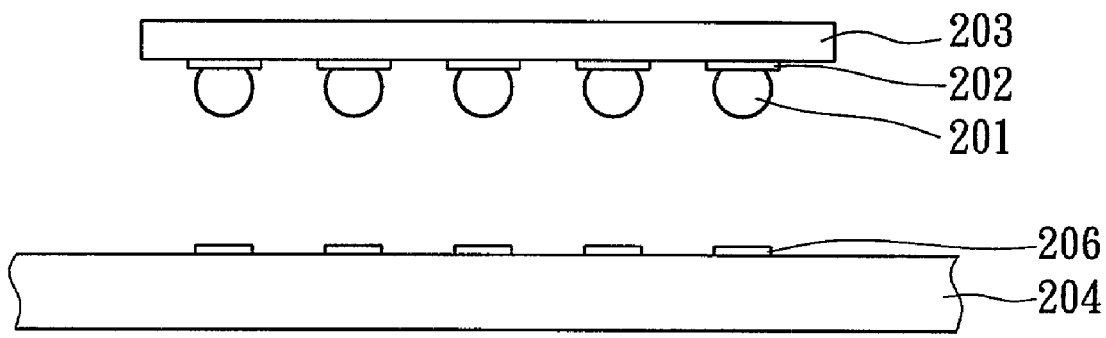
FIGS. 2A and 2B are cross-sectional views of a prior art of the typical flip chip devices with the use of metal bumps.
Figure 2B:
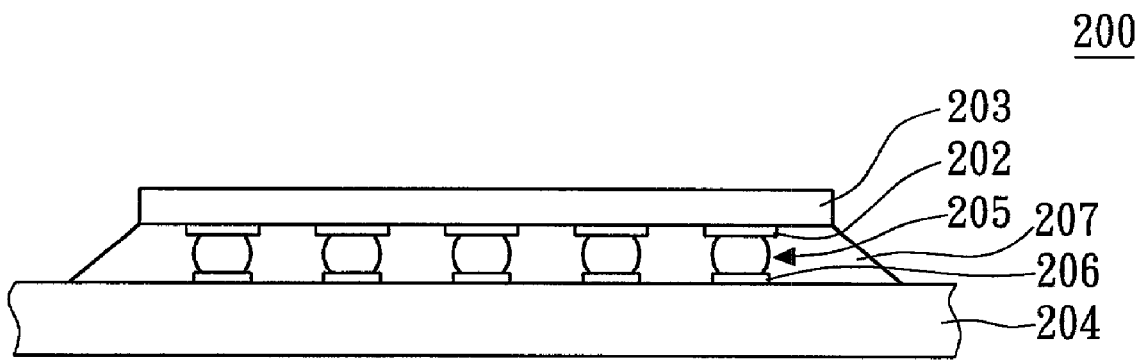
Figure 3A:
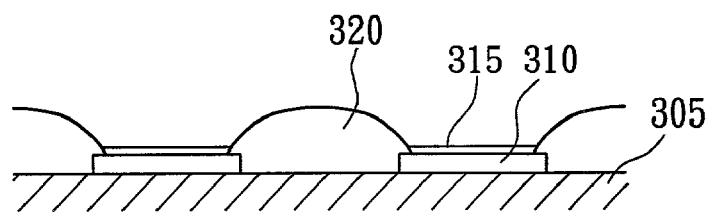
FIGS. 3A to 3G are cross-sectional views showing formation of electroplate solder on an organic circuit board for flip chip joints and board to board solder joints in accordance with one embodiment of the present invention.

Now referring to FIG. 3A, in accordance with a preferred embodiment of the present invention, there is initially provided an organic circuit board 305, which has the contact pads 310 on its surface. The insulative layers used for said organic circuit board 305 may be made of an organic material or a fiber-reinforced organic material or a particle-reinforced organic material, etc., for example, epoxy resin, polyimide, bismeleimide triazine, cyanate ester, polybenzocyclobutene, or glass fiber composite thereof, etc. Said contact pad 310 is formed typically from a metal material, such as copper. A popular barrier layer 315 includes an adhesive layer of nickel and a protective layer of gold may be formed to cover said pad 310. However, said barrier layer 315 may also be made of nickel, palladium, silver, tin, nickel/palladium, chromium/titanium, palladium/gold, or nickel/palladium/gold, etc., which can be made by electoplating, electroless plating, or physical vapor deposition, etc. A solder mask layer 320 is finally deposited on the surface of said circuit board 305 to protect the circuitry and provide insulation.

In order to fabricate solder bumps by electroplating on a non-conductive surface, a conductive seed layer formed on the non-conductive surface is required to initiate the electroplating. In general, the seed layer is prevailingly formed by electroless deposition in the conventional manufacturing industry of organic circuit boards. In such a process, the surface must be immersed in a chemical solution first to form a catalytic surface (e.g. sensitizer, including stannous chloride, titanium chloride, etc.; and activator, including acidified palladium chloride, acidified gold chloride, acidified silver chloride, etc.) and then again immersed in an electroless plating solution to form a conductive seed layer. With assistance of the seed layer, electroplating can thus be carried out to form metal bumps. However, the use of electroless plating for formation of the seed layer on the organic circuit substrate has several disadvantages. One significant problem is that the organic circuit board exposed to the chemical solutions, i.e. sensitizer solution, activation solution, and electroless solution, will significantly damage (corrosively) the solder mask layer and thus cause the reliability problem of the circuit board. Yet another problem is that sensitizer and activation solutions commonly contain a vast amount of chloride ions, which may penetrate into the solder mask layer and remain in the solder mask layer after immersion and also result in the reliability problem of the organic circuit board. Still another problem is that the noble metal, e.g. palladium, gold, and silver, etc. is commonly used to act as the catalytic metal on the non-conductive surface, which is rather difficult to be removed and of high risk to form residue on the surface of the solder mask layer. Simultaneously, etching of the notable metal may also tend to significantly damage the solder mask layer. In such a case, the reliability of the organic circuit board also inevitably becomes an issue.

In an effort to avoid the above disadvantages, i.e. the significant damage to the solder mask layer, the present invention proposes a method to form a metal seed layer without dipping the organic circuit board in any chemical solutions. In the method, the metal layer used as the seed layer is directly deposited on the surfaces of the organic circuit board by physical vapor deposition (PVD) or chemical vapor deposition (CVD), such as sputtering, evaporation, arc vapor deposition, ion beam sputtering, laser ablation deposition, plasma enhanced CVD, metallorganic CVD, etc. With assistance of such a seed layer, the fabrication of the solder bumps with the use of such a metal seed layer on the organic circuit boards will be described in the following.

Figure 3B:
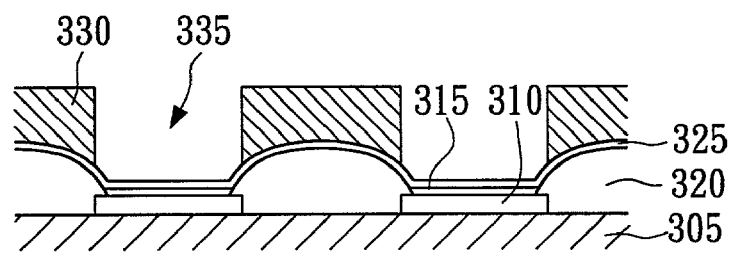
Figure 3C:
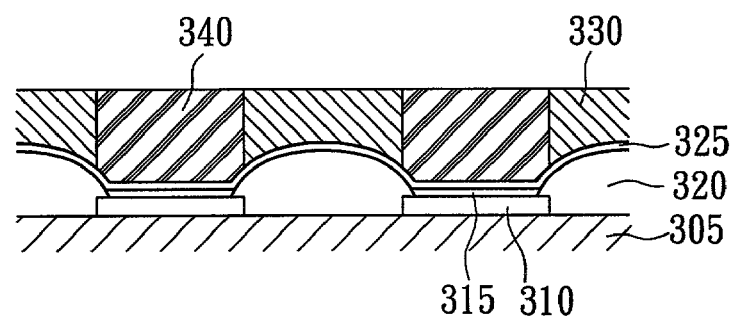
Figure 3D:
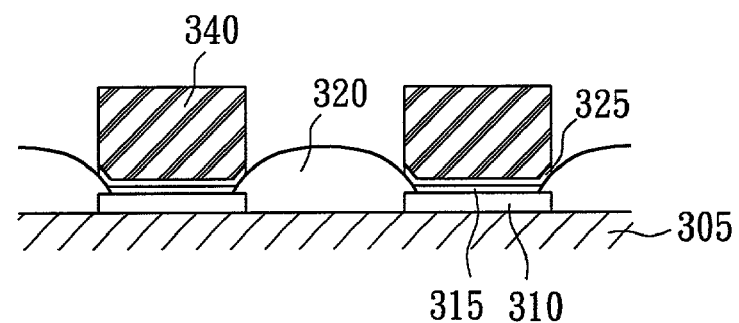

Referring now to FIG. 3B, in accordance with a preferred embodiment of the present invention, a metal seed layer 325 is deposited on the surface of said circuit board 305, by PVD or CVD. A resist layer 330 with the openings 335 is then formed and covers said seed layer 325, as shown in FIG. 3C, and subsequently the electroplate solder 340 is formed in said opening 335. As shown in 3D, both said resist 330 and said metal seed layer 325 beneath said resist 330 are then removed. Finally, see FIG. 3E, at a reflow temperature sufficient to melt and reflow said solder 340, the solder bumps 345 are formed on said contact pads 310.

Figure 3E:
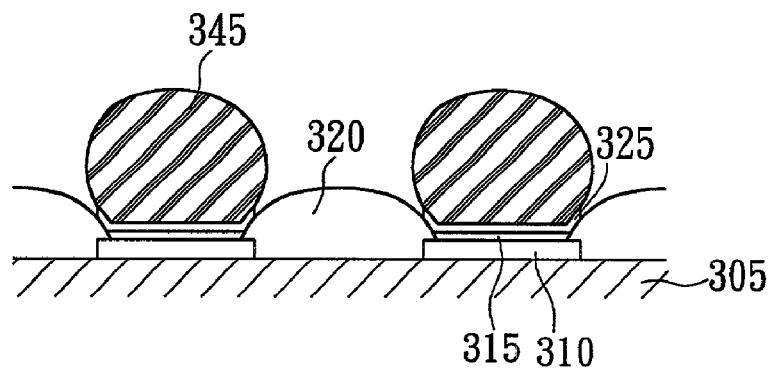
Figure 3F:
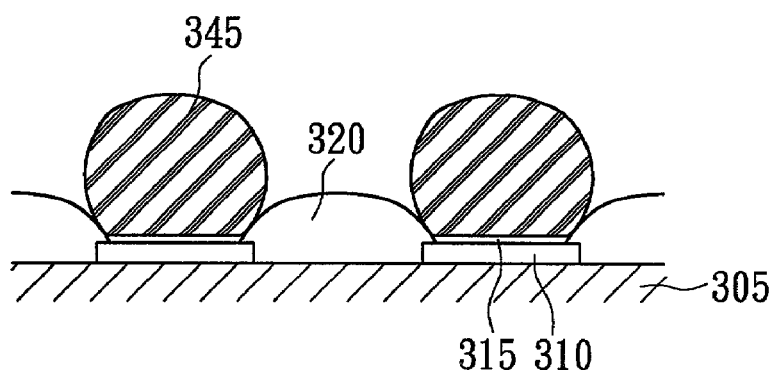

According to the present invention, said metal seed layer 325 may be made of a metal or an alloy or made of multilayer of metals, such as copper, tin, cobalt, tin-lead alloy, chromium-copper alloy, titanium/nickel (bi-metal), tin/copper, chromium/chromium-copper alloy/copper, or nickel/tin/copper multilayer etc. However, the noble metal, such as gold, silver, palladium, platinum, molybdenum, and tantalum, etc., should be avoided to be used as a part of said seed layer 325, since those metals are difficult to be removed without significantly damaging said solder mask layer 320 during the etching step. The thickness of said seed layer 325 is better less than 0.1 millimeter, however preferably between 0.0001 millimeter and 0.005 millimeter. Depending on the solubility of said seed layer 325 in the solder material, there are two phenomena that could be observed. One is shown in FIG. 3E, in which said seed layer 325 does not completely dissolve into said solder bumps and still exists after the reflow process, such as said seed layer 325 made of nickel and said solder bumps made of tin or tin-lead alloy. The other as shown in FIG. 3F is that said seed layer 325 does dissolve completely into said solder bumps 345 and said seed layer 325 disappears after the reflow process, such as said seed layer 325 made of tin and said solder bumps 345 made of tin-lead or tin-copper alloy.

According to the practical operation, the tin/copper bi-layer as said seed layer 325 is a good choice. In such a materials design, said copper completely covering said tin layer is used to prevent oxidation of said tin layer during the resist patterning step. By the way, if necessary, said copper surface may be roughened for obtaining good adhesion between said copper and said resist layer 330. In the process, just before plating, said copper is removed in said opening 335 of said resist 330, and subsequently in plating, said tin is used to provide the plating current paths and a clean surface for electroplate solder. In addition, in the reflow process, since said tin could dissolve into said solder bumps 345, the composition of said solder bumps 345 could thus be easily controlled. Furthermore, once nickel is chosen and used as said barrier layer 315, said tin is able to function to block the contact between said nickel and the plating solution during plating to protect the plating solution, since commonly nickel may dissolve into the plating solution and destroy the performance of the plating solution.

According to the practical operation, the single tin layer as said seed layer 325 is also a good choice. In such a materials design, said resist 330 is directly placed on said tin layer (i.e. seed layer) 325. In the process, just before plating, said tin surface in said opening 335 of said resist 330 is pre-cleaned, and subsequently in plating, said tin layer is used to provide the plating current paths and a clean surface for electroplate solder. For the tin layer as said seed layer 325, in order to facilitate good electroplating process, the thickness of said tin layer in said opening 335 is better larger than 0.0001 mm after the pre-cleaning step.

Figure 3G:
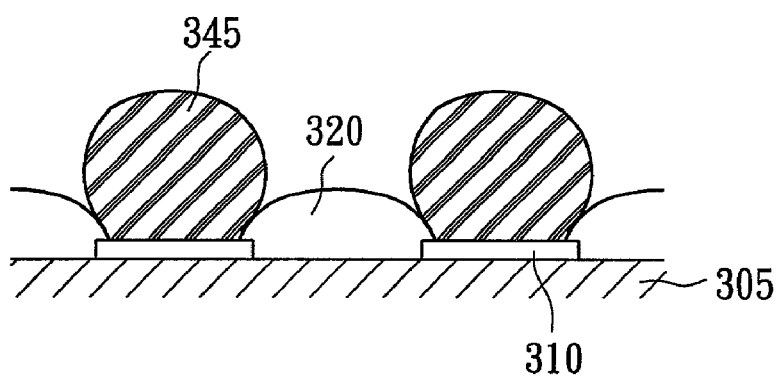

According to the present invention, when said barrier layer 315 is not used, the above method can also be applied. As shown in FIG. 3G, said solder bumps 345 are formed in direct contact with said contact pad 310.

In accordance with a preferred embodiment of the present invention, said solder material 340 is an alloy made by the mixture of the elements selected from the group consisting of lead, tin, silver, copper, bismuth, antimony, zinc, nickel, aluminum, magnesium, indium, tellurium, and gallium, etc. After the reflow process, a cleaning process, e.g. ultrasonic cleaning, may be conducted to remove the flux residues.

Importantly, thinner said seed layer 325 is found better. Since the thinner seed layer can be removed sooner in the etching solution, the time required for said organic circuit board 305 immersed in said etching solution could be shortened. In such a case, the damages to said solder mask layer 320 and electroplate solder 340 by said etching solution will be lowered down to an acceptable low level. In another respect, at the reflow process, when said seed layer 325, such as tin, is dissolvable in said electroplate solder 340, such as tin-lead or tin-copper solder, said thinner seed layer 325 would make a smaller amount of tin dissolved in said solder bump 345. In such a case, the alloy composition of said solder bump 345 would become much easier to be controlled. According to the practical operation, said seed layer, 0.0002 to 0.005 millimeter works well. The selection of said etching solution composition has been long recognized in the art and can be referred to some popular metallography books, for example, "Metallographic etching", Gunter Petzow, American Society for Metals, Metals Park, Ohio, (1978).

In accordance with a preferred embodiment of the present invention, said seed layer 325 can also be formed by an electroless plating or electroplating method, wherein the catalytic metal does not use noble metal but uses copper as the catalytic metal. The typical examples for forming such a catalytic copper on a non-conductive surface can be found in the U.S. Pat. Nos. 3,993,491 and 3,993,848, the disclosures of which are hereby incorporated by reference. With assistance of the copper catalytic surface, said metal seed layer 325 could thus be formed by electroless plating. Certainly, as an alternative way, said metal seed layer 325 can also be formed by electroplating after a short time period of electroless plating. In the beginning, the catalytic copper is formed on the non-conductive surface, and then a first thin metal layer is formed by electroplating over said catalytic copper. Afterwards, a second thin metal layer is formed over said first thin metal layer. In this case, said seed layer 325 is a combination of said first and second thin layers. Also, the damages to said solder mask layer 320 could be mitigated, since the catalytic copper (which is not noble metal) can be easily removed in said etching solution. Through the above-mentioned electroless or electroplating process for making said seed layer 325, said electroplate solder bumps 345 formed on an organic circuit board 305 can thus be constructed, as shown in FIGS. 3E, 3F, and 3G.

Figure 4A:
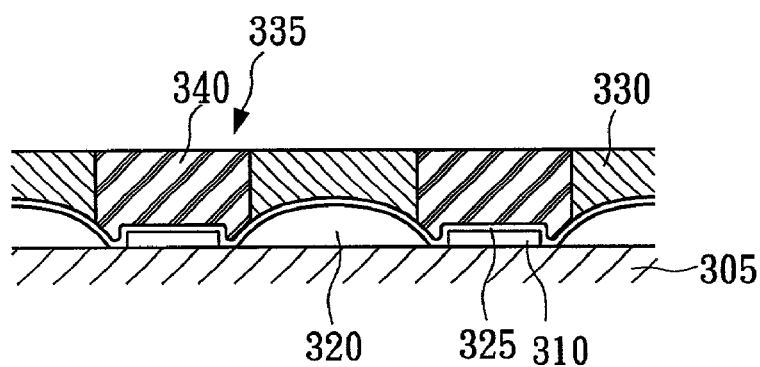
FIGS. 4A to 4C are cross-sectional views showing formation of electroplate solder on an organic circuit board for flip chip joints and board to board solder joints in accordance with another embodiment of the present invention.
Figure 4B:
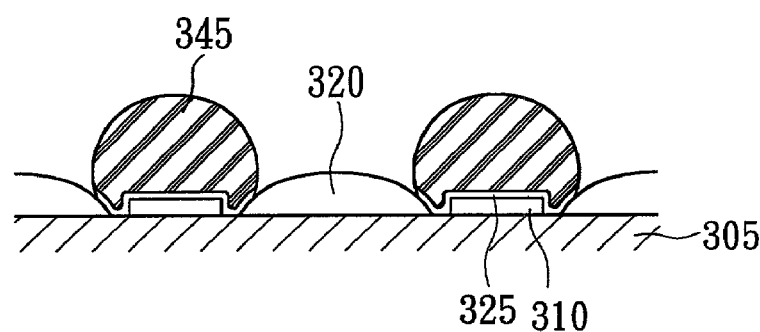
Figure 4C:
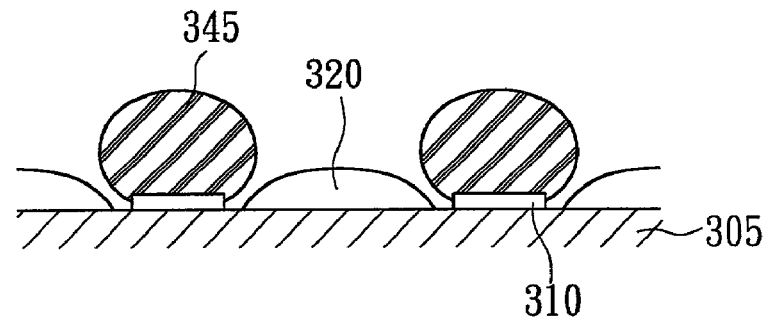

According to the present invention, said solder mask layer 320 is not limited to cover a portion of said contact pad 310 surface. As shown in FIG. 4A, said solder mask layer 320 is deposited on the surface of said organic circuit board 305 but does not cover any portion of said contact pad 310 surface. In turn, said seed layer 325 and resist 330 with said openings 335 (not shown) are formed. Subsequently, said electroplate solder 340 is formed in said opening 335. After removal of said resist 330 and seed layer 325 beneath said resist 330, said solder bumps 345 can be formed by the reflow process. There are also two phenomena that could be observed, depending on the solubility of said seed layer 325 in said solder bumps. For a lower solubility case, as shown in FIG. 4B, said seed layer 325 still exists after the reflow process. In contrast, for a higher solubility case, as shown in FIG. 4C, said seed layer 325 disappears after the reflow process.

Figure 5A:
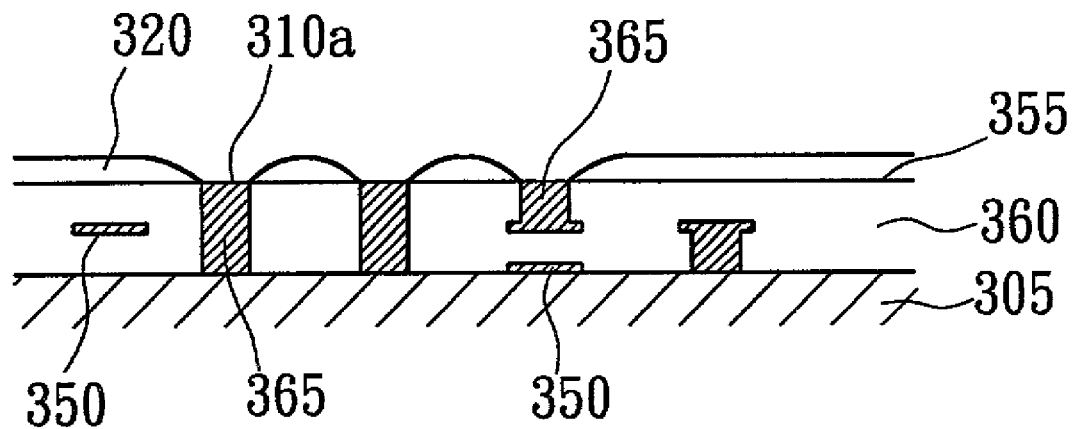
FIGS. 5A to 5B are cross-sectional views showing formation of electroplate solder on an organic circuit board for flip chip joints and board to board solder joints in accordance with another embodiment of the present invention.
Figure 5B:
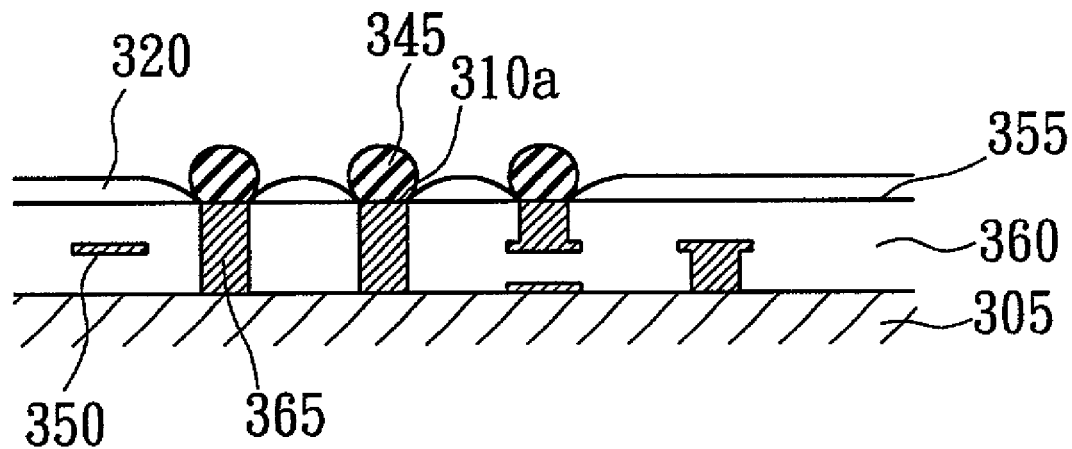

According to the present invention, said contact pad 310 is not limited to any configuration and size. As shown in FIG. 5A, the upper most three circuit layers 350 of said organic circuit board 305 are only illustrated. As can be observed, the surface of the contact pad 310a and the surface 355 of the insulative layer 360 are at the same plane. A solder mask layer 320 is deposited and patterned to expose said contact pad 310a. The vertical circuit lines 365 are commonly formed by the so-called "stacked via" technique. In such a case, the electroplate solder bumps 345 can also be made on said contact pad 310a by means of the method proposed in the present invention.

Figure 6A:
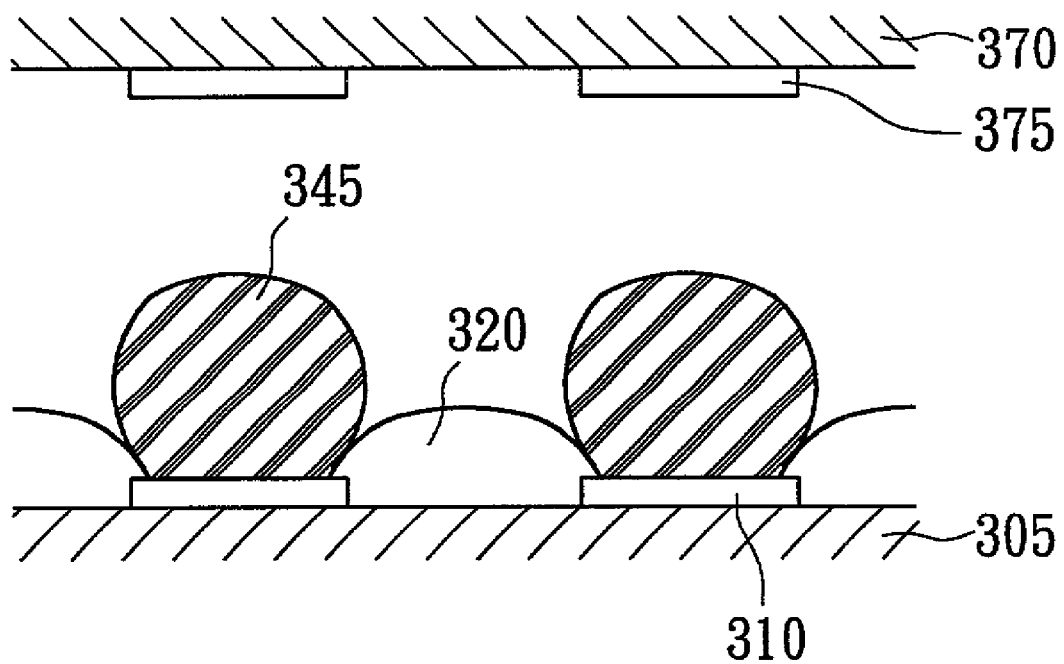
FIGS. 6A to 6B are cross-sectional views showing formation of electroplate solder on an organic circuit board for flip chip joints and board to board solder joints in accordance with another embodiment of the present invention.
Figure 6B:
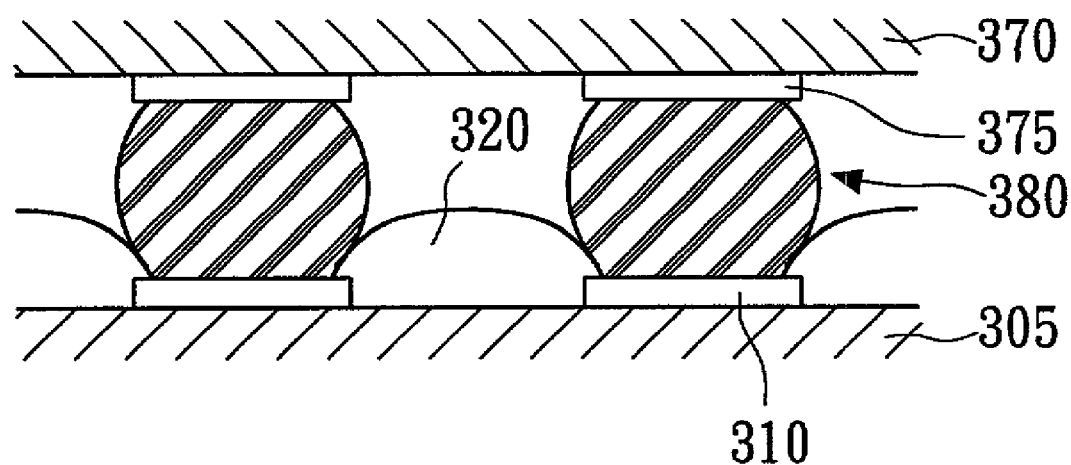

In accordance with a preferred embodiment of the present invention, said electroplate solder bumps 345 can be applied for forming flip chip joints. As shown in FIG. 6A, an IC chip 370 with the electrode pads 375 is attached to said organic circuit board 305. At a reflow temperature, a flip chip joint 380 can be formed in between said contact pad 310 and electrode pad 375, as illustrated in FIG. 6B.

Figure 7A:
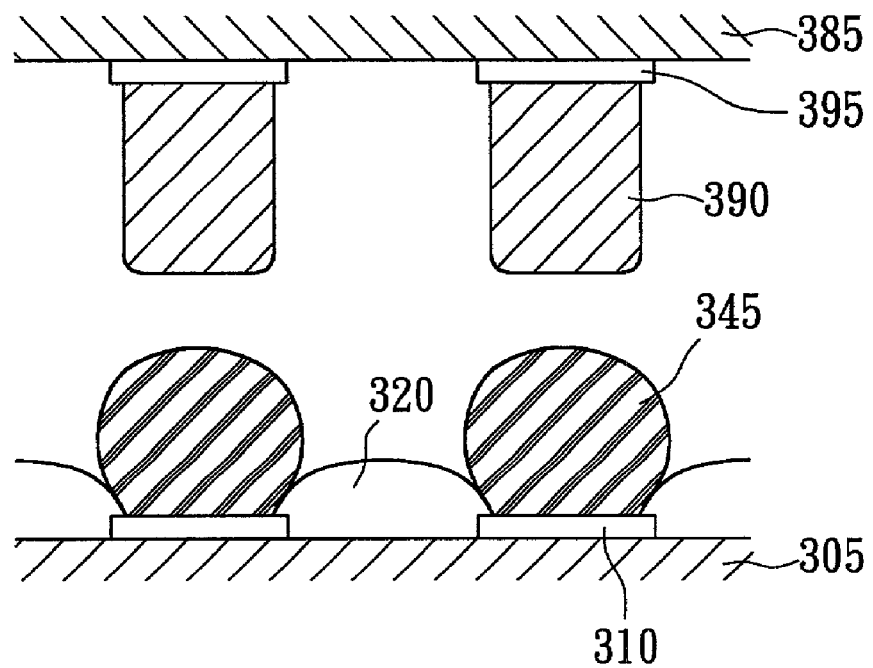
FIGS. 7A to 7B are cross-sectional views showing formation of electroplate solder on an organic circuit board for flip chip joints and board to board solder joints in accordance with another embodiment of the present invention.
Figure 7B:
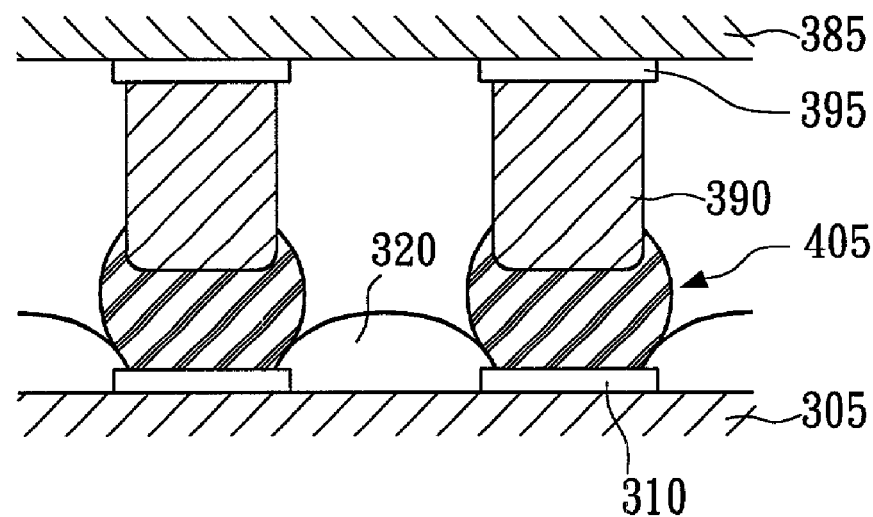

In accordance with a preferred embodiment of the present invention, said electroplate solder bumps 345 can be applied for forming flip chip joints with the use the metal bumps on the IC chip. As shown in FIG. 7A, an IC chip 385 with a metal bump 390 on each electrode pad 395 is attached to said organic circuit board 305. At a reflow temperature, a flip chip joint 405 can be formed in between said contact pad 310 and electrode pad 395, as illustrated in FIG. 7B. In this invention, said metal bumps 390 can be made of a metal or an alloy or a stacking of several metals, such as solder bumps, gold bumps, copper bumps, or copper posts covered with solder caps, etc. and can be any shape, such as stud bumps, ball bumps, columnar bumps, or others.

Figure 8A:
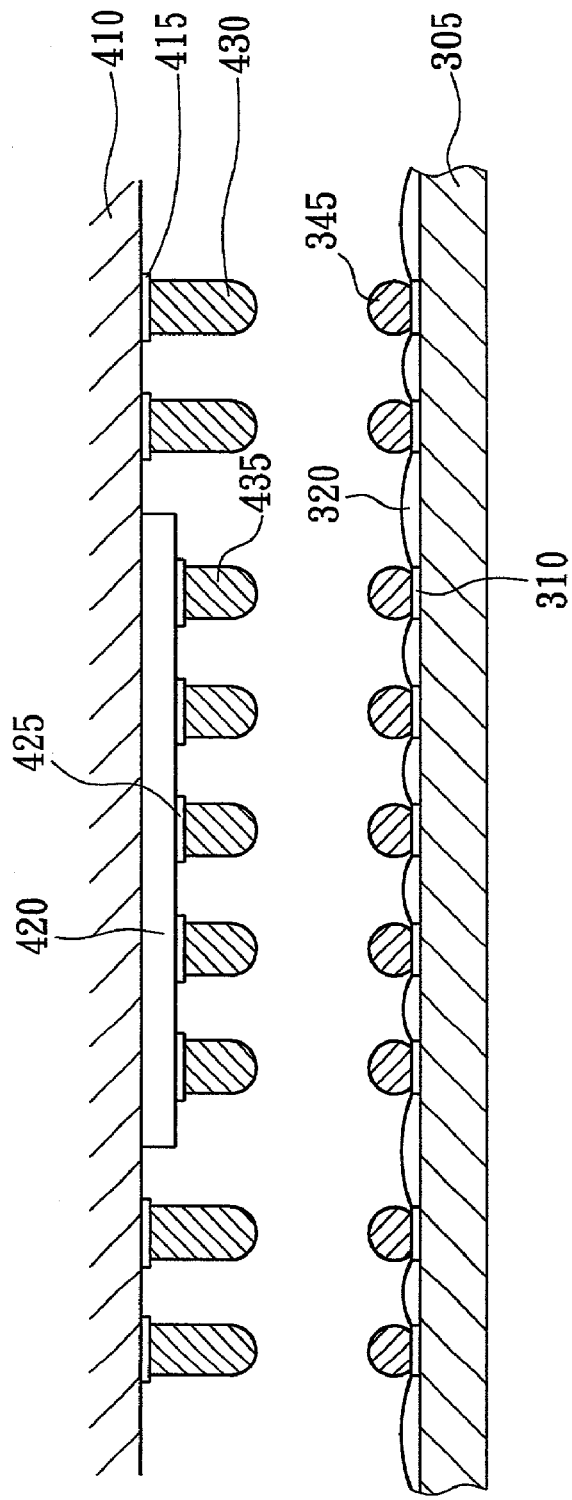
FIGS. 8A to 8B are cross-sectional views showing formation of electroplate solder on an organic circuit board for flip chip joints and board to board solder joints in accordance with another embodiment of the present invention.
Figure 8B:
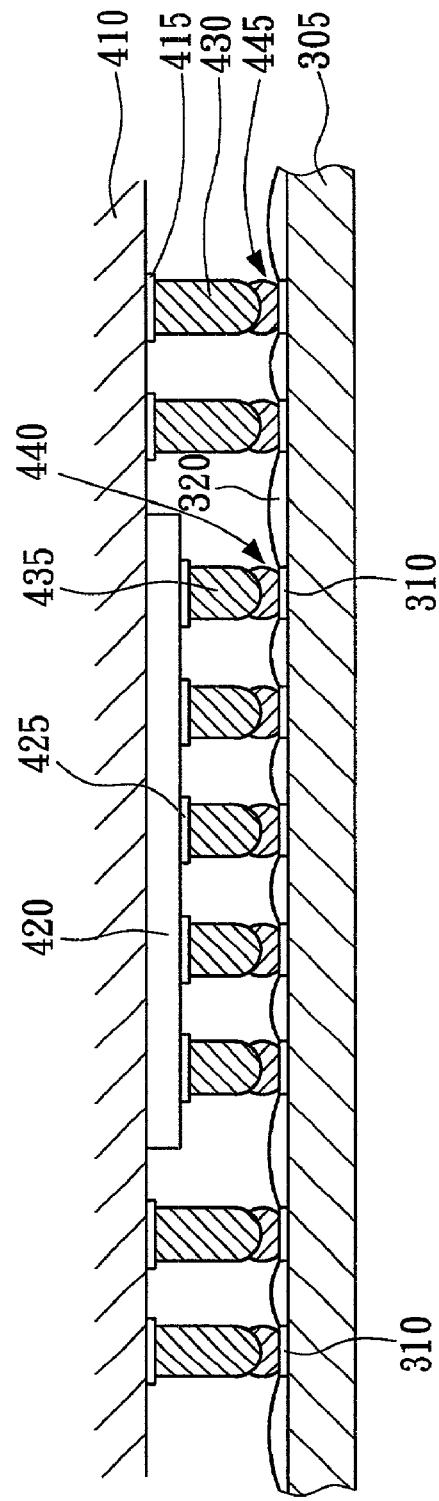

In accordance with a preferred embodiment of the present invention, said electroplate solder bumps 345 can be applied for forming flip chip joints and board to board solder joints. As shown in FIG. 8A, a circuit board 410, which can be an organic circuit board or a ceramic circuit board, has the contact pads 415 on its surface and an IC chip 420 with the electrode pads 425 is bonded to the surface of said circuit board 410. A metal bump 430 is formed on each contact pad 415 and the other metal bump 435 is formed on each electrode pad 425. Said circuit board 410 is then attached to said organic circuit board 305. At a reflow temperature, a flip chip joint 440 in between said contact pad 310 and electrode pad 425 and a board to board solder joint 445 in between said contact pad 310 and contact pad 415 can be formed, as illustrated in FIG. 8B. In this invention, said metal bumps 430 can be made of a metal or an alloy or a stacking of several metals, such as solder bumps, gold bumps, copper bumps, or copper posts covered with solder caps, etc. and can be any shape, such as stud bumps, ball bumps, columnar bumps, or others.

While novel features of the present invention have been described with reference to one or more particular embodiments herein, those skilled in the art will recognize that many modifications and variations of the present invention are possible. Therefore, the scope of the present invention should be limited only by the following claims.

The invention claimed is:

1. A method of forming electroplated solder on an organic circuit board for attaching an IC chip, comprising:
    providing an organic circuit board including a surface bearing electrical circuitry that includes at least one contact pad;
    forming a solder mask layer that is placed on the board surface and patterned to expose the contact pad;
    coating the surfaces of the solder mask layer and the contact pad with aqueous solutions which at least contains copper ions followed by reduction of the copper ions;
    forming a first thin non-noble metal layer that is deposited by electroless plating over the board surface;
    forming a second thin metal layer that is deposited by electroplating over the first thin metal film;
    forming a resist layer over the second thin metal layer, and forming at least one opening located at the contact pad;
    forming a solder material in the opening by electroplating;
    removing the resist layer, and then removing the first and second thin metal layers beneath the resist layer; and
    reflowing the solder material to form a solder bump, wherein the first and second thin metal layers beneath the solder bump are dissolved completely into the solder bump.

2. The method of claim 1, wherein the first thin metal layer is made of a metal selected from the group consisting of copper, tin, and tin-lead alloy.

3. The method of claim 1, wherein the thin metal layer is a multilayer structure made of metals selected from the group consisting of copper, tin, nickel, chromium, titanium, copper-chromium alloy, and tin-lead alloy.

4. The method of claim 1, wherein the second thin metal layer is made of a metal selected from the group consisting of copper, tin, and nickel.

5. The method of claim 1, wherein the total thickness of the first and second thin metal layers is less than 0.005 millimeter.

6. The method of claim 1, wherein the solder material is an alloy made by the mixture of the elements selected from the group consisting of lead, tin, silver, copper, bismuth, antimony, zinc, nickel, aluminum, magnesium, indium, tellurium, and gallium.

7. The method of claim 1, further comprising the following step before the step of forming said first thin metal layer:
    forming a barrier layer on said contact pad.

8. The method of claim 7, wherein said barrier layer is made of metals selected from a group consisting of copper, tin, nickel, chromium, titanium, copper-chromium alloy, tin-lead alloy, and any alloy thereof.

9. The method of claim 1, wherein said organic circuit board includes insulative layer is made of an organic material.

10. The method of claim 9, wherein said organic material is selected from the group consisting of epoxy resin, polyimide, bismeleimide triazine, cyanate ester, polybenzocyclobutene, and a glass fiber composite.

* * * * *